United States Patent [19]
Mejia

[11] Patent Number: 6,040,712
[45] Date of Patent: Mar. 21, 2000

[54] APPARATUS AND METHOD FOR PROTECTING A CIRCUIT DURING A HOT SOCKET CONDITION

[75] Inventor: Manuel Mejia, San Jose, Calif.

[73] Assignee: Altera Corporation, San Jose, Calif.

[21] Appl. No.: 09/317,710

[22] Filed: May 24, 1999

Related U.S. Application Data

[60] Provisional application No. 60/110,260, Nov. 30, 1998.

[51] Int. Cl.[7] .............................................. H03K 19/0175
[52] U.S. Cl. .................................. 326/82; 326/56; 326/83
[58] Field of Search .................................. 326/56, 57, 58, 326/80, 81, 83, 86, 112, 119, 121

[56] References Cited

U.S. PATENT DOCUMENTS

| | | | |
|---|---|---|---|
| 5,646,551 | 7/1997 | Ting | 326/83 |
| 5,825,206 | 10/1998 | Krishnamurthy et al. | 326/81 |
| 5,862,390 | 1/1999 | Ranjan | 395/750.01 |

*Primary Examiner*—Michael Tokar
*Assistant Examiner*—Anh Tran
*Attorney, Agent, or Firm*—William S. Galliani; Pennie & Edmonds LLP

[57] ABSTRACT

A circuit includes an output node, a set of output transistors operative to control the signal level on the output node, a first voltage supply, and a second voltage supply. A hot socket detection circuit identifies when the first voltage supply or the second voltage supply is below a predetermined value indicative of a hot socket condition. In response to a hot socket condition, the hot socket detection circuit generates control signals that place the set of output transistors in a high impedance state.

20 Claims, 4 Drawing Sheets

APPARATUS AND METHOD FOR PROTECTING A CIRCUIT DURING A HOT SOCKET CONDITION

This application claims priority to the provisional patent application entitled: "Hot-Socket Protection Circuit", Ser. No. 60/110,260, filed Nov. 30, 1998.

BRIEF DESCRIPTION OF THE INVENTION

This invention relates generally to integrated circuits. More particularly, this invention relates to a dynamic hot socket protection circuit for used in mixed-voltage systems.

BACKGROUND OF THE INVENTION

Digital systems are commonly embedded on printed circuit boards. Different integrated circuits positioned on a printed circuit board may operate at different voltages. For example, with improvements in process technology, integrated circuits use lower power supply voltages, such as 3.3 Volts or 2.5 Volts, or even lower. Integrated circuits made with these processes should remain compatible with previous generations of integrated circuits. For example, a new generation 3.3 Volt integrated circuit may need to be used on a printed circuit board with an old generation 5 Volt integrated circuit. Systems of this type are commonly referred to as mixed-voltage systems.

The 3.3 Volt integrated circuit will need to have the proper supply and input voltages for operation. In addition, the 3.3 Volt integrated circuit should supply or generate the proper output voltages for interfacing with the other integrated circuits. Proper interfacing of the integrated circuits is essential for proper functional operation. Further, proper interfacing will prevent undesirable conditions, such as overstressing the devices, avoiding possible high current or latch-up conditions, and other similar concerns, thereby improving device longevity.

Many circuit architectures in mixed-voltage systems rely upon separate noisy and quiet supply voltage schemes. For example, an I/O driver may be coupled to a noisy supply while the on-chip conversion circuitry is coupled to the quiet supply. By separating the power supplies in this fashion, the circuitry connected to the quiet power supply is isolated somewhat from switching and other types of noise present on the noisy power supply.

Sometimes it is necessary to remove a circuit from a mixed-voltage system without shutting off the power within the system. This situation is referred to as a "hot socket" condition. This situation arises frequently in systems that must be up 24 hours a day, 7 days a week. If not properly designed, a chip can interfere with the rest of the system during a hot socket condition. Problems arise because as the chip is inserted, a race condition exists between the power pins and the input/output pins. If system signals reach the chip input/outputs before the system power reaches the chip's power pins, the input/outputs may behave erratically, thereby causing a disturbance to the system. The disturbance can range from an inconsequential glitch to one that disables the system.

In view of the foregoing, it would be highly desirable to provide a mechanism to identify a hot socket condition, and thereafter isolate the output pins of the effected circuit until the hot socket condition is completed.

SUMMARY OF THE INVENTION

A circuit includes an output node, a set of output transistors operative to control the signal level on the output node, a first voltage supply, and a second voltage supply. A hot socket detection circuit identifies when the first voltage supply or the second voltage supply is below a predetermined value indicative of a hot socket condition. In response to a hot socket condition, the hot socket detection circuit generates control signals that place the set of output transistors in a high impedance state.

Thus, the circuit of the invention identifies a hot socket condition, and thereafter isolates output pins until the hot socket condition is completed. Consequently, the invention provides a convenient mechanism for supporting hot socket replacement of semiconductors on a printed circuit board. Advantageously, the circuit of the invention is readily implemented with a relatively few number of standard electronic components.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
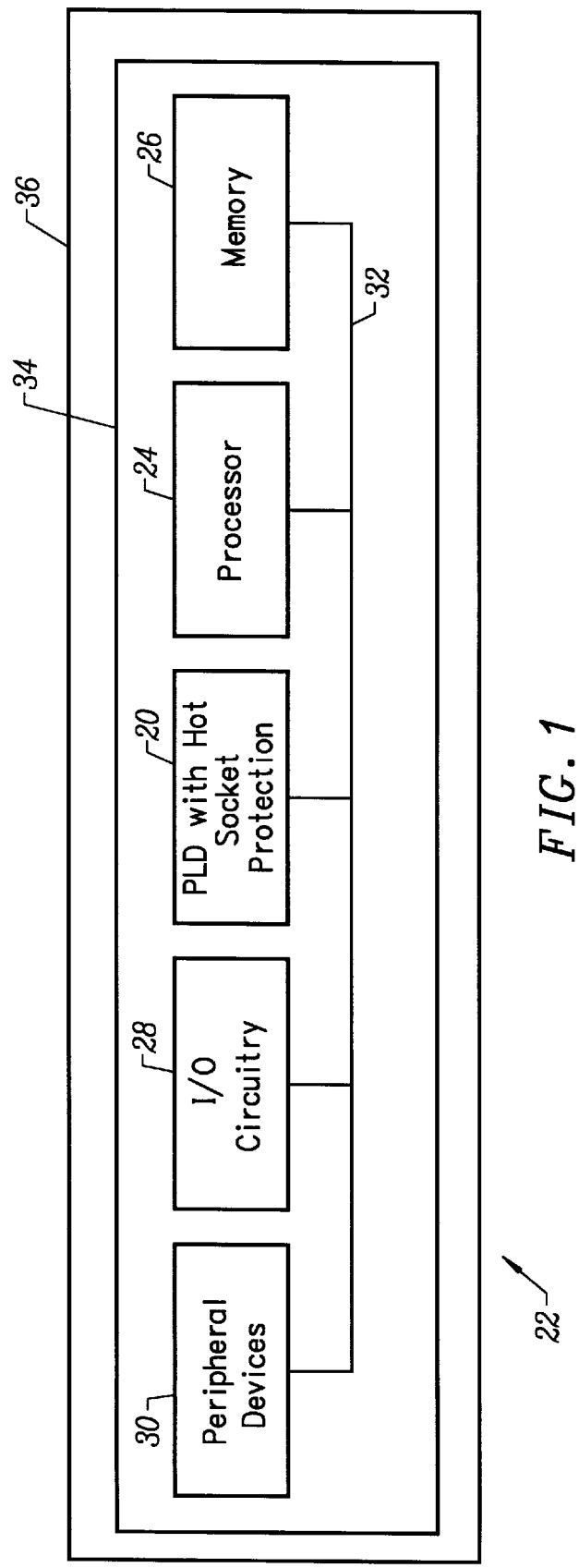
FIG. 1 illustrates a data processing system utilizing a programmable logic device with an output buffer constructed in accordance with an embodiment of the invention.

FIG. 1 illustrates a programmable logic device (PLD) 20 incorporating an output buffer in accordance with the invention. PLDs (sometimes referred to as PALs, PLAs, FPLAs, PLDs, EPLDs, EEPLDs, LCAs, or FPGAs) are well-known integrated circuits that provide the advantages of fixed integrated circuits with the flexibility of custom integrated circuits. Such devices allow a user to electrically program standard. off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241, 224 and 4,871,930, and the Altera Data Book, June 1996, all incorporated herein by reference. The latter are described in, for example, U.S. Pat. Nos. 5,258,668; 5,260,610; 5,260, 611; and 5,436,575, and the Altera Data Book, June 1996, all incorporated herein by reference.

The PLD 20 forms a part of a data processing system 22. The data processing system 22 may include one or more of the following components: a processor 24, a memory 26, input/output circuitry 28, and peripheral devices 30. These components are coupled together by a system bus 32 and are populated on a circuit board 34, which is contained in an end-user system 36.

The system 22 can be used in a wide variety of applications, such as computer networking, data networking, instrumentation, video processing, digital signal processing, or any other application where the advantage of using re-programmable logic is desirable. The PLD 20 can be used to perform a variety of logic functions. For example, the PLD 20 can be configured as a processor or controller that works in cooperation with processor 24. The PLD 20 may also be used as an arbiter for arbitrating access to a shared resource in the system 22. In yet another example, the PLD 20 can be configured as an interface between the processor 24 and one of the other components in the system 22.

Instances may arise in which the PLD 20 must be replaced while the remaining components in the system 22 remain operative. The present invention is directed toward solving problems that arise in such an instance. During hot socket insertion of a new PLD 20, a race condition is created between the power pins and the input/output pins of the PLD 20. If system signals reach the PLD input/outputs before the system power reaches the chip's power pins, the input/outputs may create disturbances in the remainder of the system 22. The present invention prevents this problem in PLDs that operate with mixed voltages, such as a quiet voltage supply and a noisy voltage supply.

Figure 2:
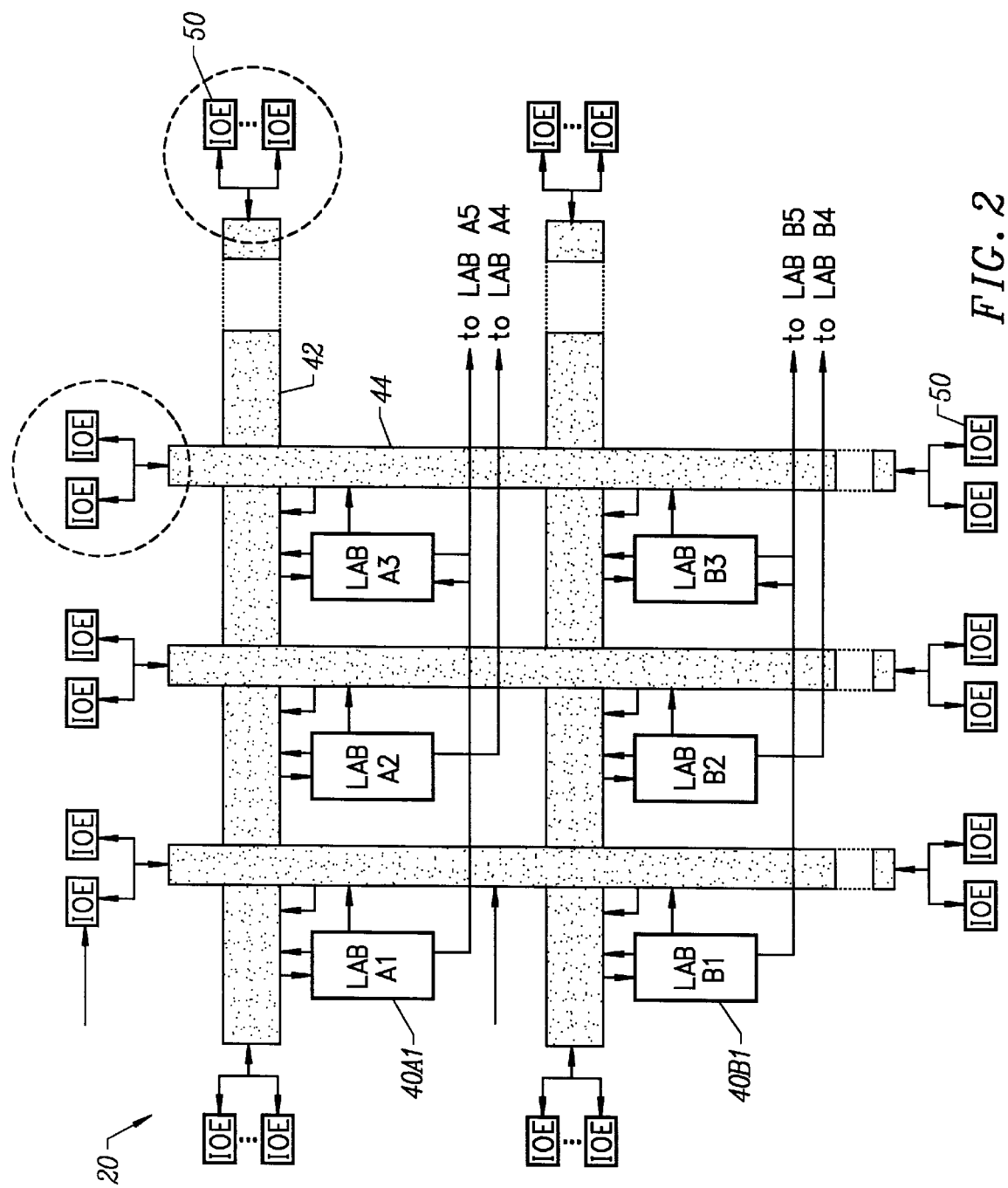
FIG. 2 illustrates a programmable logic device constructed in accordance with an embodiment of the invention.

FIG. 2 illustrates a programmable logic device 20 in accordance with the invention. The programmable logic device 20 includes a set of logic array blocks 40. As known in the art, a logic array block 40 performs programmed logic operations. Row interconnect circuitry 42 and column interconnect circuitry 44 link the various logic array blocks 40. Row interconnect circuitry 42 and column interconnect circuitry 44 are known in the art. The invention may be constructed using logic array blocks 40, row interconnect circuitry 42, and column interconnect circuitry 44 of the type used in the MAX® and FLEX® series of PLDs sold by Altera Corporation, San Jose, Calif.

Input/output elements 50 are positioned at the ends of the row interconnect circuitry 42 and column interconnect circuitry 44. The input/output elements 50 are used for standard input/output functions. The input/output elements 50 include input buffers and output buffers. The input buffers may be implemented using prior art architectures. On the other hand, the output elements or output buffers are constructed in accordance with the invention. As described below, the output buffers are configured such that they are shut-off during a hot socket state. Thus, the output buffers do not create erroneous signals that can effect system performance.

The output buffer of the invention is implemented in a semiconductor (chip) used in a mixed-voltage environment. That is, the output buffer of the invention relies upon a quiet or internal voltage supply (Vccint) and a noisy or input/output voltage supply (Vccio). The circuit of the invention also relies upon a third voltage, which is referred to as PADV. PADV is the voltage on the pad to which the output buffer is connected. During a hot socket state, the pad may be exposed to digital high voltage signals from other components in the system 22.

Vccint and PADV can both touch the diffusion of an output buffer transistor. Thus, the well-bias voltage for the output buffer transistor needs to be the higher of Vccint and PADV. The output of this well bias circuitry is referred to as VCPAD. VCPAD is always the higher of Vccint and PADV.

Figure 3:
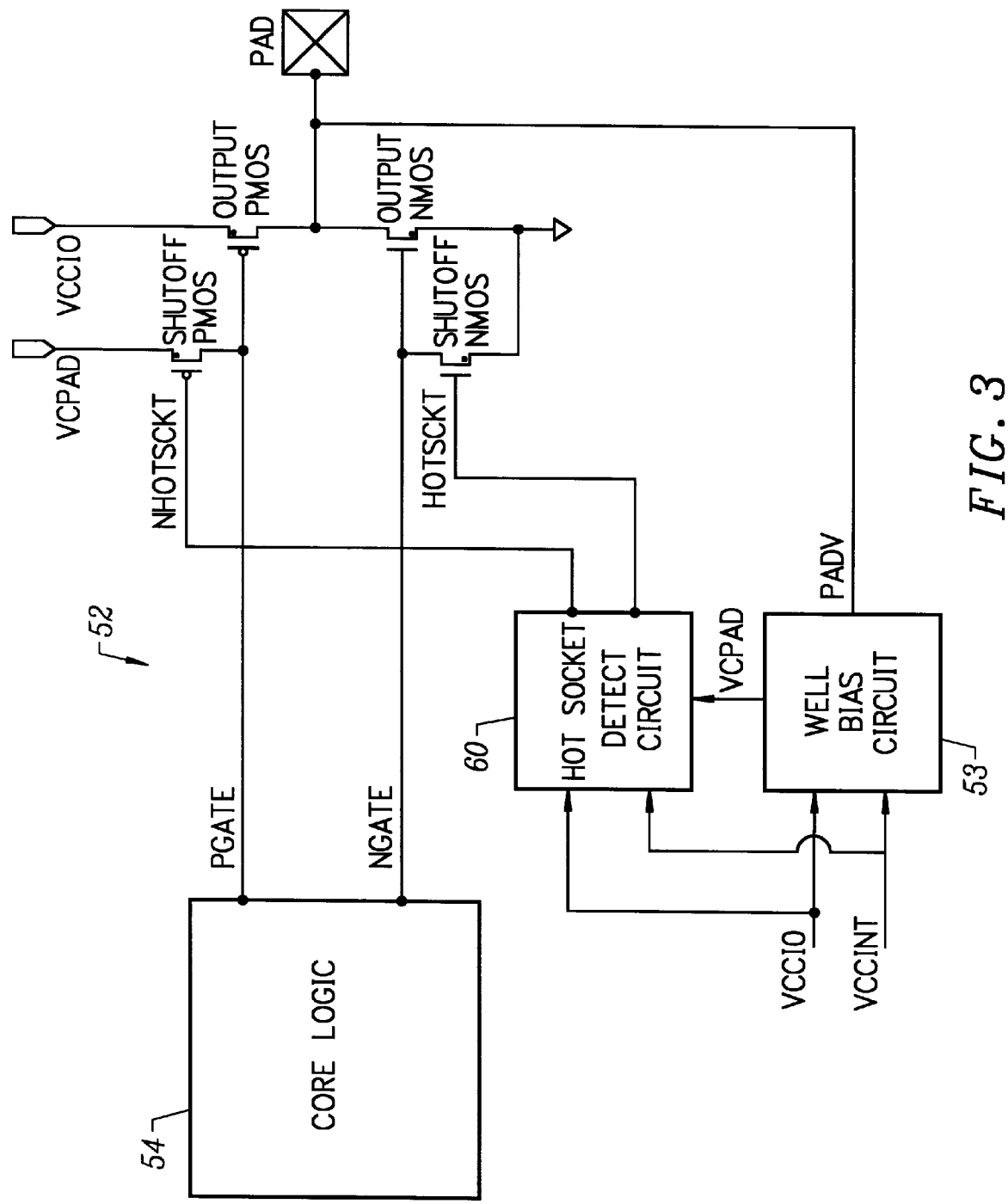
FIG. 3 illustrates an output buffer with a hot socket detection circuit in accordance with an embodiment of the invention.

FIG. 3 illustrates an output buffer 52 constructed in accordance with an embodiment of the invention. The output buffer 52 includes a well bias circuit 53. The well bias circuit 53 is connected to an output node or PAD. As discussed above, the PAD carries a voltage PADV. The PADV signal may be a digital high signal during a hot socket condition, as the output node or PAD receives signals from other elements in the system 22. The well bias circuit 53 also receives a quiet voltage supply Vccio signal and a noisy voltage supply signal Vccint. The well bias circuit 53 is configured to produce a VCPAD output signal that is always the higher of Vccint and PADV. Those skilled in the art will appreciate that this functionality may be implemented in any number of ways.

The output buffer 52 receives drive signals PGATE and NGATE from core logic 54. The core logic 54 may be, for example, a signal generated from a logic array block 40 of FIG. 2. The PGATE signal controls the pull-up transistor OUTPUT PMOS, while the NGATE signal controls the pull-down transistor OUTPUT NMOS. The pull-up transistor and the pull-down transistor control the digital signal on the output pad (PAD) of the output buffer 52.

A hot socket detect circuit 60 is used to control the gate signal at the pull-up transistor OUTPUT PMOS and the pull-down transistor OUTPUT NMOS, thereby over-riding the signals from the core logic 54. As shown in FIG. 3, the hot socket detect circuit 60 receives three input signals: Vcpad, Vccio, and Vccint. Based upon these signals, the circuit determines if a hot socket condition exists. If such a condition does exist, the circuit 60 generates a digital low NHOTSCKT signal, which causes transistor SHUTOFF PMOS to turn-on, thereby turning off pull-up transistor OUTPUT PMOS. The circuit 60 also responds to a hot socket condition by generating a digital high signal HOTSCKT, which turns-on transistor SHUTOFF NMOS. When the SHUTOFF NMOS transistor tuns-on, it pulls down the gate of the pull-down transistor OUTPUT NMOS, causing the pull-down transistor to shut-off. Thus, the hot socket detect circuit 60 operates to shut-off both the pull-up and pull-down transistors associated with the output pin (PAD) of the output buffer 52. Therefore, the hot socket detect circuit generates signals that establish a tri-state or high impedance condition that isolates the output buffer from damage during a hot socket condition.

Figure 4:
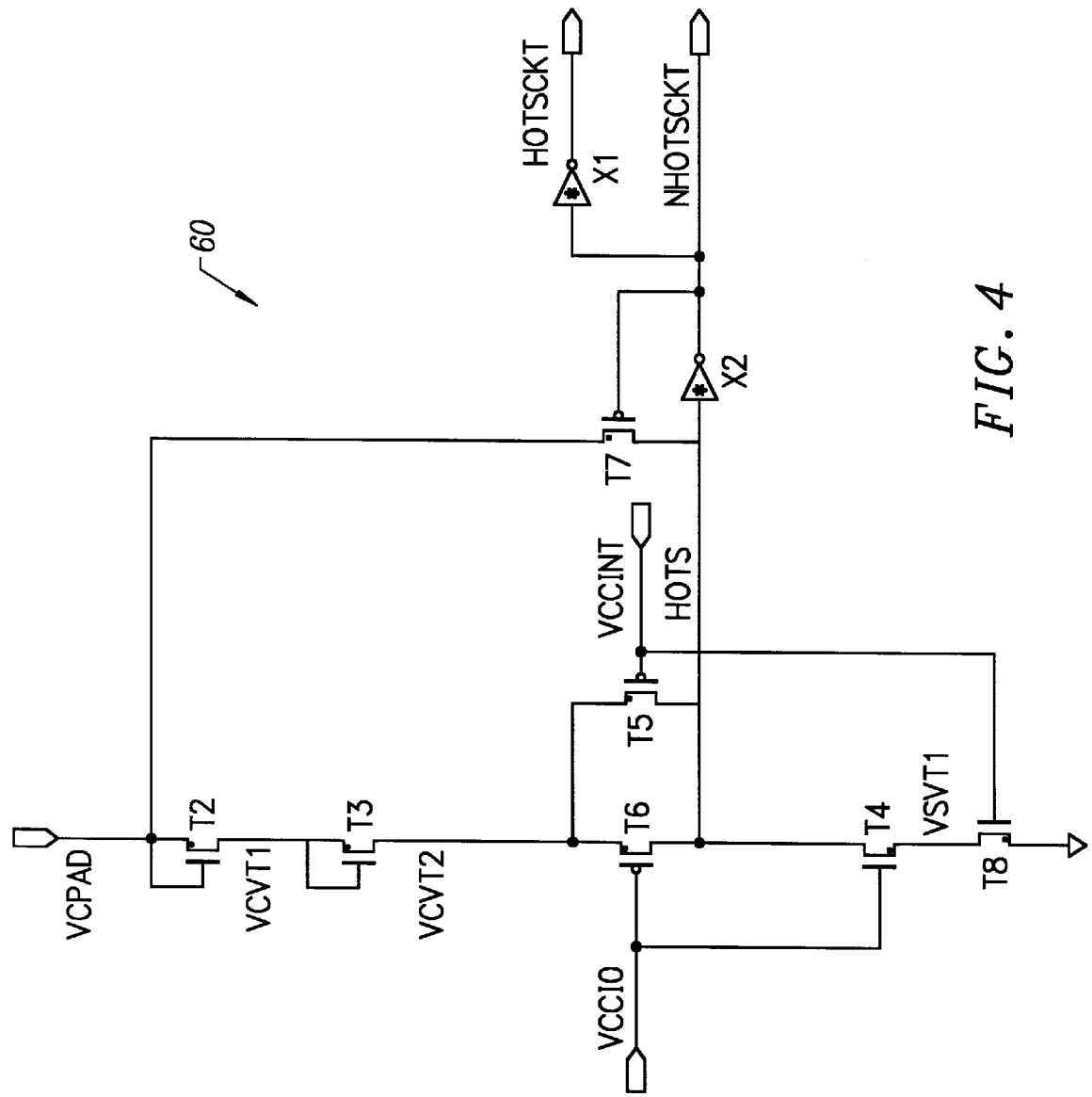
FIG. 4 illustrates a hot socket detection circuit in accordance with an embodiment of the invention.

FIG. 4 illustrates a hot socket detection circuit 60 constructed in accordance with an embodiment of the invention. The circuit 60 detects a hot socket condition. In particular, the circuit identifies a condition that can arise when a PLD 20 is inserted into the system 22 while the rest of the system is operative. In such a state, VCPAD may be powered on, but either Vccint or Vccio may still be low. In other words, a voltage signal may exist on the output pad (PAD), but the quiet voltage supply Vccint and/or the noisy voltage supply Vccio may not have powered up. In such a state, the previously described output transistors of FIG. 3 are shut-off or placed in a high impedance tri-state condition.

As previously indicated, VCPAD is the voltage produced by the well bias circuit 53 and is always equal to the higher of Vccint and PADV. Step-down circuitry is used to step-down the voltage from VCPAD. In the embodiment of FIG. 4, transistors T2 and T3 are used as step-down circuitry to produce a voltage at node VCVT2 that is never higher than Vccint or Vccio in steady-state operation. Thus, the voltage at node VCVT2 does not cause transistors T5 and T6 to turn-on during steady-state operation. If necessary, additional transistors may be used to reach a desired VCVT2 value.

Transistors T5 and T6 are on when Vccint or Vccio are one Vt below VCVT2. This occurs during a hot socket condition when Vccint and Vccio are absent and a power up condition as Vccint and Vccio ramp up to their full values. This condition drives the node HOTS to a digital high value. Inverter X2 then drives a digital low value onto the NHOTSCKT node, while inverter X1 causes a digital high signal to be driven onto the HOTSCKT node.

Transistor T7 and inverter X2 form a half-latch that level-restores the HOTS node to VCPAD. In other words, when the digital low signal from inverter X1 is applied to the gate of PMOS transistor T7, transistor T7 turns-on, thereby connecting the voltage VCPAD to the HOTS node.

Node NHOTSCKT is low during a hot socket condition. Inverter X1 provides an active-high indicator of a hot socket condition on node HOTSCKT. HOTSCKT and NHOTSCKT are used to drive transistors that shut-off all transistors that touch the output pad, as previously described in connection with FIG. 3.

Transistors T4 and T8 are on when Vccint or Vccio are one Vt above ground. Once both transistors are on, node HOTS is discharged to ground, signaling the end of the hot socket condition.

Thus, the circuit of the invention identifies a hot socket condition, and thereafter isolates an output pad until the hot socket condition is completed. Consequently, the invention provides a convenient mechanism for supporting hot socket replacement of semiconductors on a printed circuit board. Advantageously, the circuit of the invention is readily implemented with a relatively few number of standard electronic components.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A circuit, comprising:
    an output node;
    a set of transistors operative to control the signal level on said output node;
    a first voltage supply;
    a second voltage supply; and
    a hot socket detection circuit to identify when said first voltage supply or said second voltage supply is below a predetermined value indicative of a hot socket condition, and in response thereto, generate control signals that place said set of transistors in a high impedance state.

2. The circuit of claim 1 wherein said set of transistors comprise:
    a pull-up transistor connected to said output node; and
    a pull-down transistor connected to said output node.

3. The circuit of claim 2 wherein said set of transistors further comprise:
    a shut-off PMOS transistor connected to the gate of said pull-up transistor; and
    a shut-off NMOS transistor connected to the gate of said pull-down transistor.

4. The circuit of claim 3 wherein said hot socket detection circuit applies said control signals to the gates of said shut-off PMOS transistor and said shut-off NMOS transistor, causing said shut-off PMOS transistor to turn-on and thereby shut-off said pull-up transistor, and causing said shut-off NMOS transistor to turn-on and thereby shut-off said pull-down transistor to establish said high impedance state.

5. The circuit of claim 1 wherein said hot socket detection circuit comprises:
    a voltage source node;
    a control signal node;
    a first pull-up transistor connected between said voltage source node and said control signal node, said first voltage supply being connected to the gate of said first pull-up transistor;
    a second pull-up transistor connected between said voltage source node and said control signal node, said second voltage supply being connected to the gate of said second pull-up transistor, said first voltage supply causing said first pull-up transistor to turn-on during said hot socket condition and said second voltage supply causing said second pull-up transistor to turn-on during said hot socket condition, such that a digital high signal is driven onto said control signal node.

6. The circuit of claim 5 wherein said hot socket detection circuit further comprises:
    a well bias circuit node to receive a well bias signal indicative of an output pad voltage; and
    a set of step-down transistors connected between said well bias circuit node and said voltage source node to step-down said well bias signal.

7. The circuit of claim 6 wherein said hot socket detection circuit further comprises:
    a first pull-down transistor connected between said control signal node and a ground node, said first voltage supply being connected to the gate of said first pull-down transistor; and
    a second pull-down transistor connected between said control signal node and a ground node, said second voltage supply being connected to the gate of said second pull-down transistor, said first voltage supply causing said first pull-down transistor to turn-on when a hot socket condition does not exist, and said second voltage supply causing said second pull-down transistor to turn-on when a hot socket condition does not exist, thereby discharging said control signal node to ground.

8. The circuit of claim 7 wherein said hot socket detection circuit further comprises:
    an inverter with an input node connected to said control signal node and an output node coupled to said set of transistors.

9. The circuit of claim 8 wherein said hot socket detection circuit further comprises:
    a latch transistor with a first node connected to said well bias circuit node, a second node connected to said control signal node, and a gate connected to the output node of said inverter.

10. A programmable logic device, comprising:
    a plurality of logic array blocks;
    interconnect circuitry linking said plurality of logic array blocks; and
    a plurality of output buffers connected to said interconnect circuitry, each output buffer including
    an output node, a set of transistors operative to control the signal level on said output node, a first voltage supply, a second voltage supply, and a hot socket detection circuit to identify when said first voltage supply or said second voltage supply is below a predetermined value indicative of a hot socket condition, and in response thereto, generate control signals that place said set of transistors in a high impedance state.

11. The programmable logic device of claim 10 wherein said set of transistors comprise:

a pull-up transistor connected to said output node; and a pull-down transistor connected to said output node.

12. The programmable logic device of claim 11 wherein said set of transistors further comprise:

a shut-off PMOS transistor connected to the gate of said pull-up transistor; and a shut-off NMOS transistor connected to the gate of said pull-down transistor.

13. The programmable logic device of claim 12 wherein said hot socket detection circuit applies said control signals to the gates of said shut-off PMOS transistor and said shut-off NMOS transistor, causing said shut-off PMOS transistor to turn-on and thereby shut-off said pull-up transistor, and causing said shut-off NMOS transistor to turn-on and thereby shut-off said pull-down transistor to establish said high impedance state.

14. The programmable logic device of claim 10 wherein said hot socket detection circuit comprises:

a voltage source node;

a control signal node;

a first pull-up transistor connected between said voltage source node and said control signal node, said first voltage supply being connected to the gate of said first pull-up transistor;

a second pull-up transistor connected between said voltage source node and said control signal node, said second voltage supply being connected to the gate of said second pull-up transistor, said first voltage supply causing said first pull-up transistor to turn-on during said hot socket condition and said second voltage supply causing said second pull-up transistor to turn-on during said hot socket condition, such that a digital high signal is driven onto said control signal node.

15. The programmable logic device of claim 10 in combination with a system bus.

16. The programmable logic device of claim 10 further comprising a functional element connected to said system bus, said functional element selected from the group consisting of: a peripheral device, input/output circuitry, a processor, and a memory.

17. A method of controlling integrated circuit output signals during a hot socket condition, said method comprising the steps of:

identifying when a first voltage supply or a second voltage supply is below a predetermined value indicative of a hot socket condition; and placing output nodes of an integrated circuit in a high impedance state in response to said identifying step.

18. The method of claim 17 further comprising the steps of:

recognizing when said first voltage supply and said second voltage supply are above said predetermined value indicative of the end of said hot socket condition; and switching said output nodes of said integrated circuit to a low impedance state in response to said recognizing step.

19. The method of claim 18 wherein said identifying step includes the step of processing an output pad voltage signal to identify said hot socket condition.

20. The method of claim 19 wherein said identifying step includes the step of stepping down said output pad voltage signal.

* * * * *